(12) United States Patent
Shimizu

(10) Patent No.: US 11,698,649 B2
(45) Date of Patent: Jul. 11, 2023

(54) VAPORIZATION SYSTEM AND CONCENTRATION CONTROL MODULE USED IN THE SAME

(71) Applicant: HORIBA STEC, CO., LTD., Kyoto (JP)

(72) Inventor: Toru Shimizu, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 8 days.

(21) Appl. No.: 17/409,041

(22) Filed: Aug. 23, 2021

(65) Prior Publication Data
US 2022/0066481 A1 Mar. 3, 2022

(30) Foreign Application Priority Data

Aug. 26, 2020 (JP) ................. 2020-142830

(51) Int. Cl.
| | | |
|---|---|---|
| *G05D 11/13* | (2006.01) | |
| *G05D 7/06* | (2006.01) | |
| *G05D 21/02* | (2006.01) | |
| *G05D 16/20* | (2006.01) | |

(Continued)

(52) U.S. Cl.
CPC .......... *G05D 11/138* (2013.01); *C23C 16/448* (2013.01); *G05D 7/0623* (2013.01); *G05D 11/132* (2013.01); *G05D 16/2013* (2013.01); *G05D 21/02* (2013.01); *H01L 21/67253* (2013.01); *H01L 21/67034* (2013.01)

(58) Field of Classification Search
CPC .. G05D 11/132; G05D 11/138; G05D 7/0623; G05D 16/20; G05D 16/2013; G05D 21/02; C23C 16/448; H01L 21/67253; H01L 21/67054

USPC ...................................... 137/467.5
See application file for complete search history.

(56) References Cited

U.S. PATENT DOCUMENTS

| | | | |
|---|---|---|---|
| 8,047,510 B2* | 11/2011 | Hirata | C23C 16/52 261/65 |
| 2010/0108154 A1* | 5/2010 | Minami | G05D 11/132 137/88 |

(Continued)

FOREIGN PATENT DOCUMENTS

JP 2013-145887 7/2013

*Primary Examiner* — William M McCalister
(74) *Attorney, Agent, or Firm* — Greenblum & Bernstein, P.L.C.

(57) ABSTRACT

Provided is a concentration control module that improve responsiveness of concentration control of a vaporization system, and is used in a vaporization system. The concentration control module includes a concentration measuring part configured to measure a concentration of a source gas; a valve provided in a lead-out pipe configured to lead out the source gas from the tank; a pressure target value calculating part configured to calculate a pressure target value inside the tank by using a concentration target value of the source gas, and a concentration measured value of the concentration measuring part; a delay filter configured to generate a pressure control value by applying a predetermined time delay to the pressure target value obtained by the pressure target value calculating part; and a valve control part configured to feedback-control the valve by using a deviation between the pressure control value obtained by the delay filter, and a pressure inside the tank.

8 Claims, 4 Drawing Sheets

(51) Int. Cl.
  *C23C 16/448* (2006.01)
  *H01L 21/67* (2006.01)

(56) References Cited

U.S. PATENT DOCUMENTS

| | | | |
|---|---|---|---|
| 2011/0155264 A1* | 6/2011 | Minami | G05D 11/138 |
| | | | 137/467.5 |
| 2018/0258530 A1* | 9/2018 | Sakaguchi | C23C 16/45557 |
| 2019/0177850 A1* | 6/2019 | Shimizu | C23C 16/4482 |
| 2019/0203358 A1* | 7/2019 | Babayan | G05D 11/00 |
| 2020/0240015 A1* | 7/2020 | Shimizu | C23C 16/45544 |
| 2020/0255944 A1* | 8/2020 | Shimizu | C23C 16/52 |
| 2020/0294820 A1* | 9/2020 | Shimizu | C23C 16/52 |
| 2022/0066481 A1* | 3/2022 | Shimizu | G05D 11/132 |

* cited by examiner

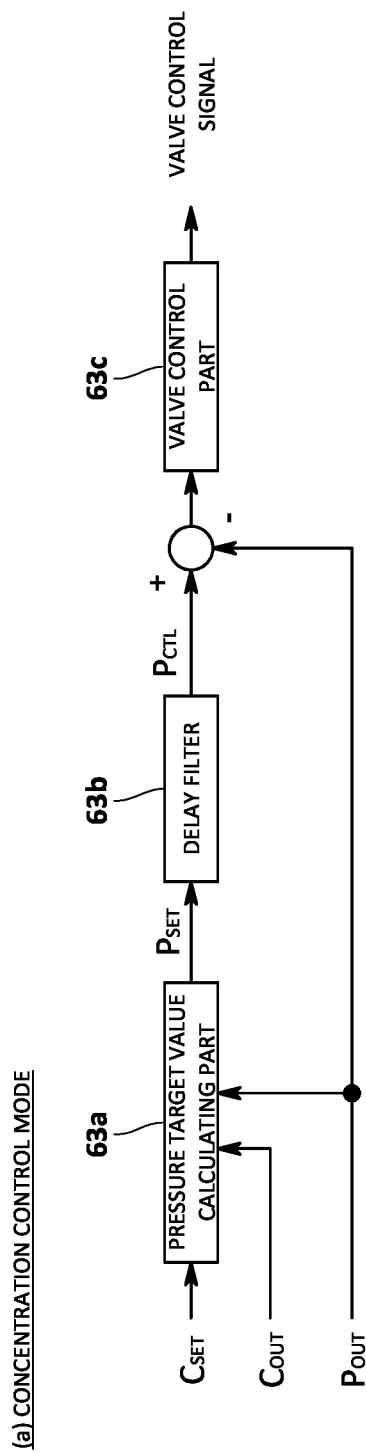
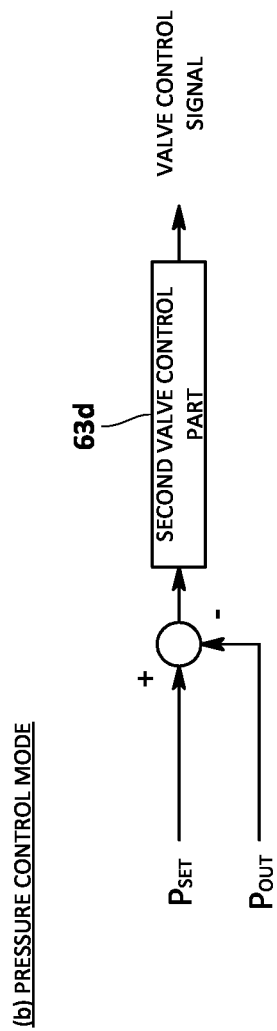
FIG. 4A
FIG. 4B

VAPORIZATION SYSTEM AND CONCENTRATION CONTROL MODULE USED IN THE SAME

BACKGROUND

Technical Field

The present invention relates to a vaporization system configured to introduce a carrier gas into a liquid or solid source, vaporize the source, and supply a source gas generated by the vaporization, and a concentration control module used in the vaporization system.

Related Art

As disclosed in JP 2013-145887 A, this type of vaporization system includes a tank configured to store a solid or liquid source, an introduction pipe configured to introduce a carrier gas into the tank and vaporize the source, and a lead-out pipe configured to lead out, from the tank, a mixed gas of the carrier gas and the source gas obtained by vaporizing the source. The lead-out pipe is provided with a concentration measuring part configured to measure a concentration of the source gas, and a control valve.

In this vaporization system, concentration control is performed by controlling the control valve provided in the lead-out pipe so that a measured concentration obtained by the concentration measuring part becomes a set concentration. The control valve is feedback-controlled by a valve control part.

For example, when the measured concentration is higher than the set concentration, the concentration of the source gas is lowered by decreasing a valve opening degree of the control valve and increasing a total pressure inside the tank. On the other hand, when the measured concentration is lower than the set concentration, the concentration is increased by increasing the valve opening degree of the control valve and decreasing the total pressure inside the tank.

However, in the concentration control described above, since feedback control is performed by using a deviation between the measured concentration and the set concentration, there is a problem that responsiveness is poor because a change in the measured concentration is delayed due to gas replacement inside the tank.

PRIOR ART DOCUMENT

Patent Document

JP 2013-145887 A

SUMMARY

The present invention has been made in view of the above-described problem, and a main object thereof is to improve responsiveness of concentration control of a vaporization system.

That is, a concentration control module according to the present invention is a concentration control module used in a vaporization system configured to introduce a carrier gas into a liquid or solid source stored inside a tank, vaporize the source, and supply a source gas generated by the vaporization, the concentration control module including: a concentration measuring part configured to measure a concentration of the source gas; a valve provided in a lead-out pipe configured to lead out the source gas from the tank; a pressure target value calculating part configured to calculate a pressure target value inside the tank by using a concentration target value of the source gas, and a concentration measured value of the concentration measuring part; a delay filter configured to generate a pressure control value by applying a predetermined time delay to the pressure target value obtained by the pressure target value calculating part; and a valve control part configured to feedback-control the valve by using a deviation between the pressure control value obtained by the delay filter, and a pressure inside the tank.

In the above-described concentration control module, the pressure target value inside the tank is calculated by using the concentration target value of the source gas and the concentration measured value of the concentration measuring part, and the concentration is controlled by controlling the valve on the basis of the pressure target value, so that responsiveness of the concentration control can be improved.

In particular, in the present invention, the pressure control value is generated by applying the predetermined time delay to the pressure target value by using the delay filter, and the valve is feedback-controlled by using the deviation between the pressure control value and the pressure inside the tank, so that unnecessary pressure fluctuation such as overshoot when the pressure target value is changed can be reduced. This also makes it possible to improve the responsiveness of the concentration control of the vaporization system.

In addition, even when a gas replacement time inside the tank changes due to a change in a flow rate of the carrier gas or a change in a volume of the tank, it is possible to perform appropriate control only by changing the delay filter without changing control parameters (for example, PID coefficients) in the valve control part.

As a specific aspect of the delay filter, it is conceivable that the delay filter performs primary delay arithmetic operation on the pressure target value to generate the pressure control value (primary delay filter). In addition, it is conceivable that the delay filter continuously changes the pressure target value at a constant rate to generate the pressure control value (ramp filter).

As a specific aspect of calculating the pressure target value, it is also conceivable that the pressure target value calculating part calculates the pressure target value by inputting the concentration target value and the concentration measured value to a predetermined arithmetic expression.

For example, it is conceivable to use the fact that the concentration of the source gas is found from "a partial pressure of the source gas/the pressure inside the tank". Specifically, it is desirable that he pressure target value calculating part calculates the pressure target value by multiplying the pressure inside the tank by a ratio between the concentration target value and the concentration measured value.

The concentration control module of the present invention may further include a second valve control part configured to feedback-control the valve by using a deviation between the pressure target value inside the tank and a pressure inside the tank, the pressure target value being input from outside, wherein a concentration control mode performed by the pressure target value calculating part, the delay filter, and the valve control part, and a pressure control mode performed by the second valve control part are switchable.

In this case, since the time delay is applied to the pressure target value in the concentration control mode, the control parameters of the valve control part can be the same as a control parameters of the second valve control part. Specifically, it is conceivable that the control parameters are PID coefficients.

A vaporization system using the above-described concentration control module is also an aspect of the present invention.

According to the present invention described above, the responsiveness of the concentration control of the vaporization system can be improved.

BRIEF DESCRIPTION OF DRAWINGS

FIG. 4A is a control block diagram showing a concentration control mode in a modified embodiment; and FIG. 4B is a control block diagram showing a pressure control mode in the modified embodiment.

DETAILED DESCRIPTION

Hereinafter, a vaporization system according to one embodiment of the present invention will be described with reference to the drawings.

<1. System Configuration>

A vaporization system 100 of the present embodiment is used, for example, in a semiconductor manufacturing process, and supplies, for example, a source gas such as isopropyl alcohol (IPA) at a predetermined concentration to a drying processing chamber of a wafer cleaning apparatus. In addition, the vaporization system may supply a source gas at a predetermined concentration, for example, to a processing chamber of a semiconductor processing apparatus such as a CVD film forming apparatus or an MOCVD film forming apparatus.

This vaporization system 100 introduces a carrier gas into a liquid or solid source, vaporizes the source, and supplies the source gas generated by the vaporization. While an example using a liquid source will be described below, the same applies to a case where a solid source is used.

Figure 1:
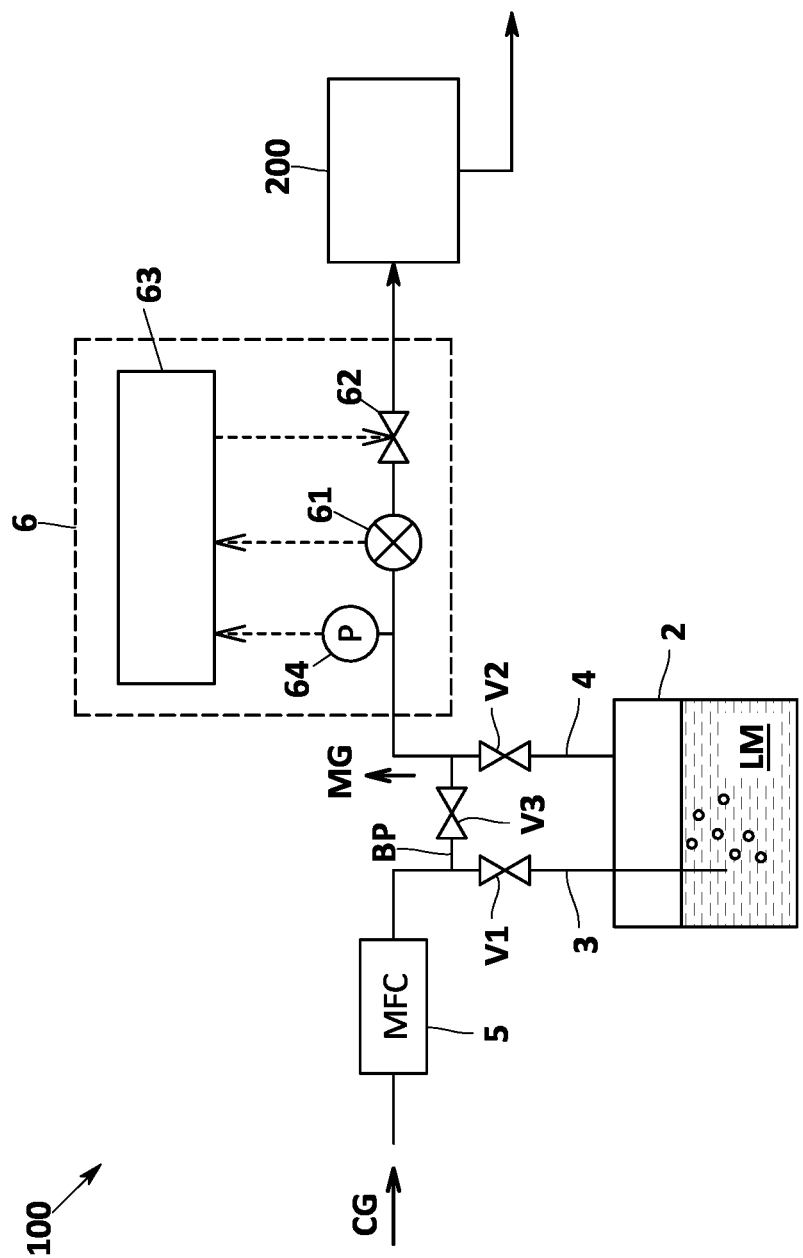
FIG. 1 is an overall schematic diagram of a vaporization system according to an embodiment of the present invention.

Specifically, as shown in FIG. 1, the vaporization system 100 includes a tank 2 configured to store a liquid source LM, an introduction pipe 3 configured to introduce a carrier gas CG into the tank 2 and bubble the carrier gas CG, and a lead-out pipe 4 configured to lead out a mixed gas MG of the carrier gas CG and the source gas obtained by vaporizing the source LM from the tank 2.

The tank 2 is, for example, a stainless steel sealed container configured to store the liquid source LM, and is heated to a constant temperature by a heating mechanism such as a heater provided outside.

A supply source (not shown) of the carrier gas such as, for example, nitrogen or hydrogen is connected to an upstream side of the introduction pipe 3, and a downstream side of the introduction pipe 3 is inserted into the tank 2. A downstream opening of the introduction pipe 3 is set at a position lower than a liquid level of the liquid source LM stored in the tank 2, and the source LM is bubbled by the carrier gas CG introduced from the introduction pipe 3 into the tank 2. The introduction pipe 3 is provided with a mass flow controller 5 for keeping a flow rate of the carrier gas supplied into the tank 2 constant.

An upstream opening of the lead-out pipe 4 is connected to an upper space (gas phase) formed in the tank 2 in a state where the liquid source LM is stored. A processing chamber 200 of a semiconductor processing apparatus is connected to a downstream side of the lead-out pipe 4. The lead-out pipe 4 is provided with a concentration control module 6 for controlling a concentration of the source gas in the mixed gas MG. A bypass pipe BP configured to bypass the tank 2 is connected to the introduction pipe 3 and the lead-out pipe 4, and the introduction pipe 3, the lead-out pipe 4, and the bypass pipe BP are provided with flow path switching valves V1 to V3 configured to switch between a flow path through which the carrier gas passes through the tank 2, and a flow path through which the carrier gas passes through the bypass pipe BP.

<2. Concentration Control Module>

Next, the concentration control module 6 of the present embodiment will be described.

As shown in FIG. 1, the concentration control module 6 includes a concentration measuring part 61 configured to measure the concentration of the source gas flowing through the lead-out pipe 4, a valve 62 provided in the lead-out pipe 4 configured to lead out the source gas from the tank 2, and control equipment 63 configured to feedback-control the valve 62 on the basis of a measured concentration of the concentration measuring part 61. In the present embodiment, a pressure measuring part 64 configured to measure a pressure (total pressure) inside the tank 2 is provided on an upstream side of the valve 62 in the lead-out pipe 4. Note that the pressure measuring part 64 may be provided separately from the concentration control module 6.

The concentration measuring part 61 continuously measures the concentration of the source gas in the mixed gas MG, and an NDIR sensor using a measurement non-dispersive infrared absorption method (NDIR), an ultrasonic sensor using a fact that a sound speed changes due to a change in the concentration of the source gas, or the like can be used.

The valve 62 is provided on a downstream side of the concentration measuring part 61 in the lead-out pipe 4, and a valve opening degree thereof is controlled by the control equipment 63.

Figure 2:
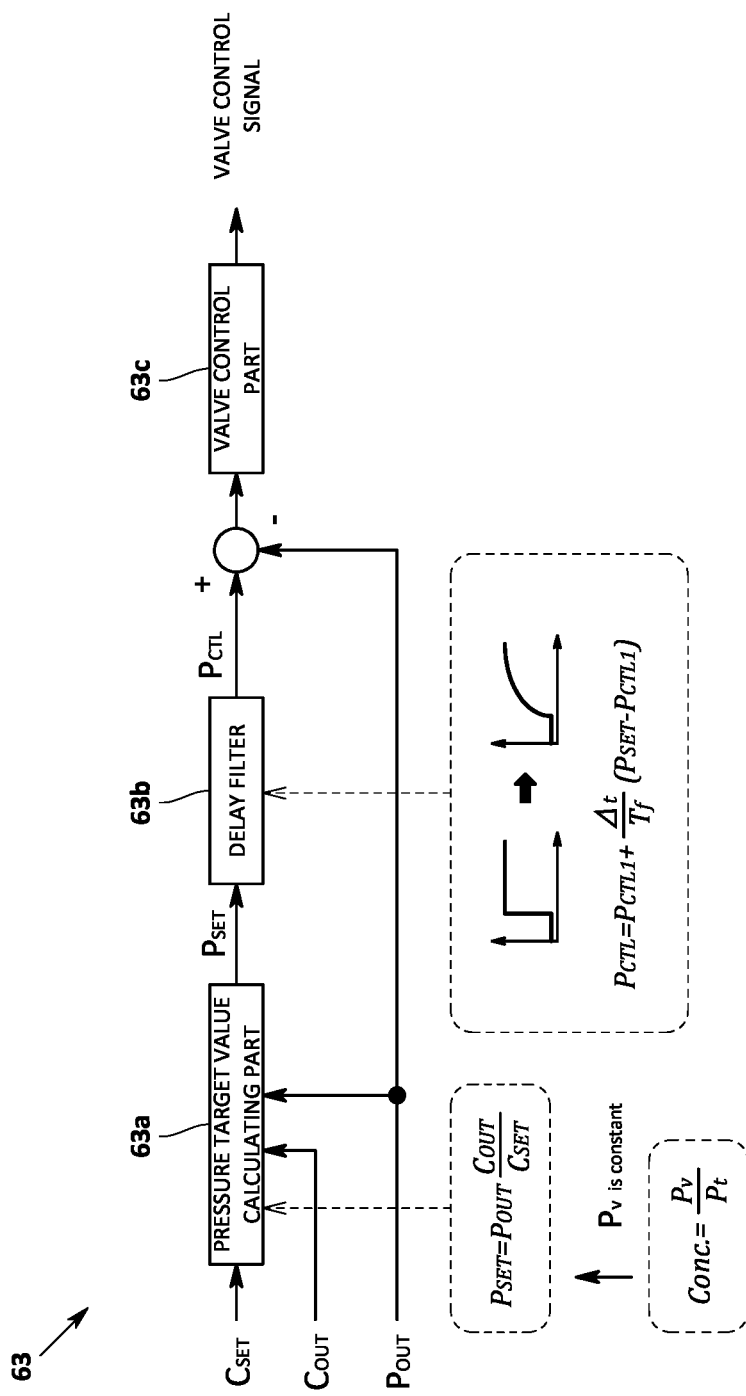
FIG. 2 is a control block diagram of a concentration control module of the same embodiment.

The control equipment 63 is a computer including a CPU, a memory, an A/D converter, an input/output interface, and the like, and functions as a pressure target value calculating part 63a, a delay filter 63b, a valve control part 63c, and the like as shown in FIG. 2 by the respective parts cooperating on the basis of a program stored in the memory.

The pressure target value calculating part 63a calculates a pressure target value ($P_{SET}$) inside the tank 2 by using a concentration target value ($C_{SET}$) of the source gas, and a concentration measured value ($C_{OUT}$) of the concentration measuring part 61.

Specifically, the pressure target value calculating part 63a calculates the pressure target value ($P_{SET}$) by multiplying a pressure (Pour) inside the tank 2 by a ratio ($C_{OUT}/C_{SET}$) between the concentration target value ($C_{SET}$) and the concentration measured value ($C_{OUT}$) as in the following formula. This is because the concentration of the source gas is found from "a partial pressure ($P_v$) of the source gas/a pressure ($P_t$) inside the tank", which uses a face that the partial pressure ($P_v$) of the source gas is substantially constant regardless of the pressure ($P_t$) in the tank as long as a source temperature, the flow rate of the carrier gas, or the like does not change. The pressure ($P_{OUT}$) inside the tank 2 is obtained by the pressure measuring part 64, and the concentration measured value ($C_{OUT}$) is obtained from the concentration measuring part 61.

$$P_{SET} = P_{OUT} \times \frac{C_{OUT}}{C_{SET}}$$

The delay filter 63*b* applies a predetermined time delay to the pressure target value ($P_{SET}$) obtained by the pressure target value calculating part 63*a* to generate a pressure control value ($P_{CTL}$).

Specifically, the delay filter 63*b* performs primary delay arithmetic operation on the pressure target value ($P_{SET}$) to generate the pressure control value ($P_{CTL}$) as represented in the following expression. Here, $P_{CTL1}$ indicates a previous pressure control value, $\Delta t$ indicates a control period, and $T_f$ indicates a parameter (time constant) for adjusting a change rate of the pressure target value.

$$P_{CTL} = P_{CTL1} + \frac{\Delta t}{T_f}(P_{SET} - P_{CTL1})$$

The valve control part 63*c* feedback-controls the valve 62 by using a deviation between the pressure control value ($P_{CTL}$) obtained by the delay filter 63*b* and the pressure ($P_{OUT}$) inside the tank 2, and outputs a valve control signal to the valve 62. Here, a PID coefficient in the valve control part 63*c* is set in advance.

Figure 3:
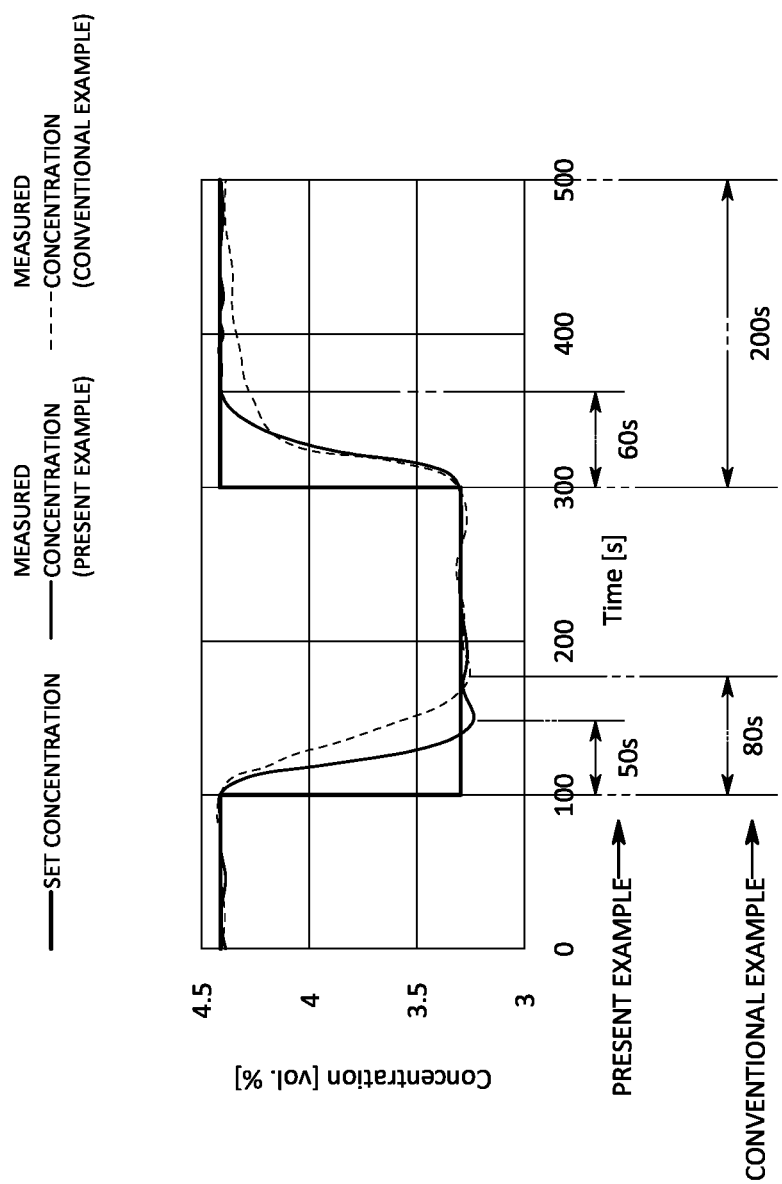
FIG. 3 is a graph of an experimental result showing fall times and rise times in a case where concentration control based on a pressure is performed in the same embodiment (present example), and in a case where conventional concentration control based on a concentration is performed (conventional example)

Next, FIG. 3 shows fall times and rise times when the set concentration (concentration target value) is changed from "4.4 vol %" to "3.3 vol %" and again changed to "4.4 vol %" in a case where the concentration control based on the pressure of the present embodiment is performed (present example) and in a case where a conventional concentration control based on the concentration is performed (conventional example).

Here, the source is IPA, a tank temperature is 23° C., the flow rate of the carrier gas is 1 SLM, and a pressure on a downstream side of the valve is 100 kPa.

When the set concentration (concentration target value) is changed from "4.4 vol %" to "3.3 vol %", the fall time of the conventional example is 80 seconds, whereas the fall time of the present example is 50 seconds, so that it is found that a response time is shortened. When the set concentration (concentration target value) is changed from "3.3 vol %" to "4.4 vol %", the rise time of the conventional example is 200 seconds, whereas the rise time of the present example is 60 seconds, so that it is found that a response time is shortened.

<3. Effects of Present Embodiment>

According to the vaporization system 100 of the present embodiment configured as described above, the pressure target value ($P_{SET}$) inside the tank 2 is calculated by using the concentration target value ($C_{SET}$) of the source gas and the concentration measured value ($C_{OUT}$) of the concentration measuring part, and the concentration is controlled by controlling the valve 62 on the basis of the pressure target value ($P_{SET}$), so that the responsiveness can be improved.

In particular, in the present embodiment, the pressure control value ($P_{CTL}$) is generated by applying the predetermined time delay to the pressure target value ($P_{SET}$) by using the delay filter 63*b*, and the valve 62 is feedback-controlled by using the deviation between the pressure control value ($P_{CTL}$) and the pressure ($P_{OUT}$) inside the tank 2. Therefore, unnecessary pressure fluctuation such as overshoot when the pressure target value ($P_{SET}$) is changed can be reduced. This also makes it possible to improve the responsiveness of the concentration control of the vaporization system 100.

In addition, even when a gas replacement time inside the tank 2 changes due to a change in the flow rate of the carrier gas or a change in a volume of the tank 2, it is possible to perform appropriate control only by changing the delay filter 63*b* without changing the control parameters (for example, PID coefficients) in the valve control part 63*c*.

<4. Other Embodiments>

For example, while the delay filter of the above-described embodiment performs the primary delay arithmetic operation, the pressure control value may be generated by continuously changing the pressure target value at a constant rate.

In addition, the pressure target value calculating part may calculate the pressure target value by inputting the concentration target value and the concentration measured value to a predetermined arithmetic expression other than the expressions exemplified in the above-described embodiment.

Further, as shown in FIG. 4B, the concentration control module may further include a second valve control part 63*d* configured to feedback-control the valve 62 by using the deviation between the pressure target value ($P_{SET}$) inside the tank 2 input from the outside, and the pressure ($P_{OUT}$) inside the tank 2. In this case, as in the above-described embodiment, a concentration control mode (FIG. 4A) performed by the pressure target value calculating part 63*a*, the delay filter 63*b*, and the valve control part 63*c*, and a pressure control mode (FIG. 4B) performed by the second valve control part 63*d* may be switchable. In this case, the control parameters (for example, PID coefficients) of the valve control part 63*c* can be the same as control parameters (for example, PID coefficients) of the second valve control part 63*d*. The pressure control mode is used, for example, in the case where the carrier gas is bypassed to the bypass pipe BP by using the flow path switching valves V1 to V3 (That is, since the carrier gas is not introduced into the tank 2, the source gas is not contained, and the concentration control does not function), or the like.

In addition, various modifications and combinations of the embodiments may be made without departing from the gist of the present invention.

REFERENCE SIGNS LIST

100 Vaporization system
2 Tank
4 Lead-out pipe
6 Concentration control module
61 Concentration measuring part
62 Valve
63*a* Pressure target value calculating part
63*b* Delay filter
63*c* Valve control part
63*d* Second valve control part

What is claimed is:

1. A concentration control module used in a vaporization system configured to introduce a carrier gas into a liquid or solid source stored inside a tank, vaporize the source, and supply a source gas generated by the vaporization, the concentration control module comprising:

a concentration measurer configured to measure a concentration of the source gas;

a valve provided in a lead-out pipe configured to lead out the source gas from the tank;

a pressure target value calculator configured to calculate a pressure target value inside the tank by using a concentration target value of the source gas, and a concentration measured value of the concentration measurer;

a delay filter configured to generate a pressure control value by applying a predetermined time delay to the pressure target value obtained by the pressure target value calculator; and a valve controller configured to feedback-control the valve by using a deviation between the pressure control value obtained by the delay filter, and a pressure inside the tank.

2. The concentration control module according to claim 1, wherein the delay filter performs primary delay arithmetic operation on the pressure target value to generate the pressure control value.

3. The concentration control module according to claim 1, wherein the pressure target value calculator calculates the pressure target value by inputting the concentration target value and the concentration measured value to a predetermined arithmetic expression.

4. The concentration control module according to claim 1, wherein the pressure target value calculator calculates the pressure target value by multiplying the pressure inside the tank by a ratio between the concentration target value and the concentration measured value.

5. The concentration control module according to claim 1, further comprising a second valve controller configured to feedback-control the valve by using the deviation between the pressure target value inside the tank and the pressure inside the tank, the pressure target value being input from outside, wherein a concentration control mode performed by the pressure target value calculator, the delay filter, and the valve controller, and a pressure control mode performed by the second valve controller are switchable.

6. The concentration control module according to claim 5, wherein control parameters of the valve controller is a same as control parameters of the second valve controller.

7. The concentration control module according to claim 6, wherein the control parameter is PID coefficients.

8. A vaporization system configured to introduce a carrier gas into a liquid or solid source stored inside a tank, vaporize the source, and supply a source gas generated by the vaporization, wherein a concentration of the source gas is controlled by using the concentration control module according to claim 1.

* * * * *